United States Patent
Avraham et al.

(10) Patent No.: US 11,853,607 B2
(45) Date of Patent: Dec. 26, 2023

(54) OPTIMIZING FLASH MEMORY UTILIZATION FOR NVME KV PAIR STORAGE

(71) Applicant: Western Digital Technologies, Inc., San Jose, CA (US)

(72) Inventors: David Avraham, Even Yehuda (IL); Alexander Bazarsky, Holon (IL); Ran Zamir, Ramat Gan (IL)

(73) Assignee: Western Digital Technologies, Inc., San Jose, CA (US)

( * ) Notice: Subject to any disclaimer, the term of this patent is extended or adjusted under 35 U.S.C. 154(b) by 152 days.

(21) Appl. No.: 17/558,954

(22) Filed: Dec. 22, 2021

(65) Prior Publication Data
US 2023/0195377 A1   Jun. 22, 2023

(51) Int. Cl.
*G06F 3/06*   (2006.01)
(52) U.S. Cl.
CPC .......... *G06F 3/0659* (2013.01); *G06F 3/0604* (2013.01); *G06F 3/0679* (2013.01)
(58) Field of Classification Search
CPC .... G06F 3/0659; G06F 3/0604; G06F 3/0679; G06F 3/0616; G06F 3/064
See application file for complete search history.

(56) References Cited

U.S. PATENT DOCUMENTS

| | | | |
|---|---|---|---|
| 7,882,300 B2 | 2/2011 | Kim et al. | |
| 8,327,226 B2 | 12/2012 | Rub | |
| 8,418,021 B2 | 4/2013 | Lin et al. | |
| 8,650,458 B2 | 2/2014 | Kim et al. | |
| 9,075,710 B2 | 7/2015 | Talagala et al. | |
| 9,214,963 B1 | 12/2015 | Garani et al. | |
| 9,317,362 B2 | 4/2016 | Khan | |
| 9,619,381 B2 | 4/2017 | Camp et al. | |
| 9,654,141 B2 | 5/2017 | Radke | |
| 9,959,067 B2 | 5/2018 | Yang et al. | |
| 10,073,732 B2 | 9/2018 | Lee et al. | |
| 10,284,231 B2 | 5/2019 | Canepa | |

(Continued)

FOREIGN PATENT DOCUMENTS

WO   2021162734 A1   8/2021

OTHER PUBLICATIONS

International Search Report and Written Opinion for International Application No. PCT/US2022/029547 dated Oct. 11, 2022.

(Continued)

*Primary Examiner* — Sean D Rossiter
(74) *Attorney, Agent, or Firm* — PATTERSON + SHERIDAN, LLP; Steven H. VerSteeg

(57) ABSTRACT

A data storage device includes a memory device and a controller coupled to the memory device. The controller is configured to determine a health of a plurality of wordlines of a block of a plurality of blocks, receive key value (KV) pair data, select a wordline of the plurality of wordlines based on the health, and program the KV pair data to the selected wordline. The KV pair data includes a value length and a relative performance indicator. The controller is further configured to mark a block of the plurality of blocks due to a high bit error rate (BER) indication, where the marked block is KV operable only. The non-KV pair data stored in the marked block is relocated to a non-marked block.

20 Claims, 4 Drawing Sheets

(56) References Cited

U.S. PATENT DOCUMENTS

| | | | |
|---|---|---|---|
| 10,693,501 B2 | 6/2020 | Park et al. | |
| 10,735,031 B2 | 8/2020 | Avraham et al. | |
| 10,770,168 B2 | 9/2020 | Cadloni et al. | |
| 10,795,760 B2 | 10/2020 | Ki | |
| 11,106,532 B1* | 8/2021 | Singidi | G06F 11/3037 |
| 11,488,684 B1* | 11/2022 | Sharon | G11C 29/021 |
| 2003/0043749 A1 | 3/2003 | Tanaka et al. | |
| 2007/0271493 A1 | 11/2007 | Oh et al. | |
| 2013/0024746 A1 | 1/2013 | Sharon et al. | |
| 2013/0086224 A1 | 4/2013 | Teraguchi | |
| 2013/0250686 A1 | 9/2013 | Marukame et al. | |
| 2014/0136927 A1 | 5/2014 | Li et al. | |
| 2014/0153654 A1 | 6/2014 | Vojcic et al. | |
| 2015/0003169 A1* | 1/2015 | Nam | G11C 11/5628 365/185.25 |
| 2016/0041783 A1 | 2/2016 | Choi et al. | |
| 2016/0103630 A1* | 4/2016 | Shen | G06F 11/008 714/37 |
| 2016/0342467 A1 | 11/2016 | Kumar et al. | |
| 2018/0358989 A1 | 12/2018 | Mehra et al. | |
| 2019/0258543 A1 | 8/2019 | Park | |
| 2020/0007158 A1 | 1/2020 | Cooper et al. | |
| 2020/0127685 A1 | 4/2020 | Chen et al. | |
| 2020/0225882 A1 | 7/2020 | Li | |
| 2020/0226065 A1 | 7/2020 | Yang et al. | |
| 2020/0235757 A1 | 7/2020 | Achtenberg et al. | |
| 2020/0301850 A1 | 9/2020 | Qiu et al. | |
| 2020/0301899 A1 | 9/2020 | Tu et al. | |
| 2021/0055886 A1 | 2/2021 | Twitto et al. | |
| 2021/0089391 A1 | 3/2021 | Kuribara | |
| 2021/0157746 A1* | 5/2021 | Lee | G06F 12/0824 |
| 2021/0191882 A1 | 6/2021 | Lee et al. | |
| 2021/0216220 A1* | 7/2021 | Kim | G06F 3/0656 |
| 2021/0218421 A1 | 7/2021 | Fainzilber et al. | |
| 2022/0147440 A1 | 5/2022 | Benisty et al. | |
| 2022/0155971 A1* | 5/2022 | Oh | G06F 3/0653 |
| 2022/0214398 A1* | 7/2022 | Hu | G01R 31/2621 |
| 2022/0342813 A1* | 10/2022 | Muchherla | G11C 16/3422 |
| 2023/0208448 A1* | 6/2023 | Avraham | H03M 13/6577 714/763 |

OTHER PUBLICATIONS

International Search Report and Written Opinion for International Application No. PCT/US2022/029546 dated Oct. 21, 2022.

International Search Report and Written Opinion for International Application No. PCT/US2022/029509 dated Sep. 23, 2022.

Pitchumani, et al., Hybrid Data Reliability for Emerging Key-Value Storage Devices, USENIX Association, 18th USENIX Conference on File and Storage Technologies, Feb. 2020, 15 pp.

Chen, et al., KVFTL: Optimization of Storage Space Utilization for Key-Value-Specific Flash Storage Devices, 2017 22nd Asia and South Pacific Design Automation Conference (ASP-DAC), 7 pp.

Kim, et al., The Key to Value: Understanding the NVMe Key-Value Standard, Live Website, Sep. 1, 2020, SNIA NSF, Networking Storage, 31 pp.

Martin, et al., NVM Express Technical Proposal for New Feature, Jun. 2020, NVM Express, Inc., 34 pp.

Adams, NVMe®Base Specification 2.0 Preview, Flash Memory Summit, 2020, NVM Express organization, 20 pp.

Samsung Key Value SSD Enables High Performance Scaling, A Technology Brief by Samsung Memory Solutions Lab, Samsung Electronics, Co. Ltd., 2017, 8 pp.

* cited by examiner

OPTIMIZING FLASH MEMORY UTILIZATION FOR NVME KV PAIR STORAGE

BACKGROUND OF THE DISCLOSURE

Field of the Disclosure

Embodiments of the present disclosure generally relate to data storage devices, such as solid state drives (SSDs), and, more specifically, storing key value (KV) pair data in a data storage device.

Description of the Related Art

A KV database works by storing a quantity of user data that is associated with a key that is addressable as a complete entity. Examples of user data that can be stored in a KV database may include photos, records, and files. From a host device point-of-view, the photo, the record, or the file may be retrieved using a single key/address, rather than using multiple addresses that includes data of the photo, the record, or the file. The data is stored as unstructured data and may be addressed using a key of variable length. Storage space of a memory device may be allocated for KV pair data in increments of bytes, where a length value of the KV pair data is associated with the necessary storage space to store the KV pair data.

Using a KV database in a data storage device may increase the performance of the data storage device. For example, the number of data transfers/second may be improved because the KV pair data to physical storage location translation layer in the host device may be removed. Furthermore, the number of commands over the bus may be reduced since an entire KV pair data may utilize a single transfer. KV pair data allows access to data on a controller using a key rather than a block address. By providing a key to store a corresponding value on a memory device, the value may be retrieved from the memory device using the corresponding key. Because the properties or health across the memory device may be uneven, the sequentially programming values of different lengths to the memory device may cause a decrease in performance, endurance, and/or throughput.

Therefore, there is a need in the art for using the size of the values of KV pair data to balance the properties of the physical blocks that are used to store the KV pair data.

SUMMARY OF THE DISCLOSURE

The present disclosure generally relates to data storage devices, such as solid state drives (SSDs), and, more specifically, storing key value (KV) pair data in a data storage device. A data storage device includes a memory device and a controller coupled to the memory device. The controller is configured to determine a health of a plurality of wordlines of a block of a plurality of blocks, receive key value (KV) pair data, select a wordline of the plurality of wordlines based on the health, and program the KV pair data to the selected wordline. The KV pair data includes a value length and a relative performance indicator. The controller is further configured to mark a block of the plurality of blocks due to a high bit error rate (BER) indication, where the marked block is KV operable only. The non-KV pair data stored in the marked block is relocated to a non-marked block.

In one embodiment, a data storage device includes a memory device and a controller coupled to the memory device. The controller is configured to determine a health of a plurality of wordlines of a block of a plurality of blocks, receive a key value (KV) pair, where the KV pair includes a value length and a relative performance indicator, select a wordline of the plurality of wordlines based on the health, and program the KV pair to the selected wordline.

In another embodiment, a data storage device includes a memory device and a controller coupled to the memory device. The controller is configured to determine a bit error rate (BER) of a page on a block, determine that the BER is greater than or equal to a BER threshold, determine that the block has had more than one high BER indication, and mark the block as key value (KV) pair operable only, where the marked block stores only KV database data.

In another embodiment, a data storage device includes memory means and a controller coupled to the memory means. The controller is configured to determine a physical storage location for key value (KV) pair data based on value length and/or relative performance and program the KV pair data to the determined physical storage location.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specifically described embodiments. Instead, any combination of the following features and elements, whether related to different embodiments or not, is contemplated to implement and practice the disclosure.

Furthermore, although embodiments of the disclosure may achieve advantages over other possible solutions and/or over the prior art, whether or not a particular advantage is achieved by a given embodiment is not limiting of the disclosure. Thus, the following aspects, features, embodiments, and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to data storage devices, such as solid state drives (SSDs), and, more specifically, storing key value (KV) pair data in a data storage device. A data storage device includes a memory device and a controller coupled to the memory device. The controller is configured to determine a health of a plurality of wordlines of a block of a plurality of blocks, receive key value (KV) pair data, select a wordline of the plurality of wordlines based on the health, and program the KV pair data to the selected wordline. The KV pair data includes a value length and a relative performance indicator. The controller is further configured to mark a block of the plurality of blocks due to a high bit error rate (BER) indication, where the marked block is KV operable only. The non-KV pair data stored in the marked block is relocated to a non-marked block.

Figure 1:
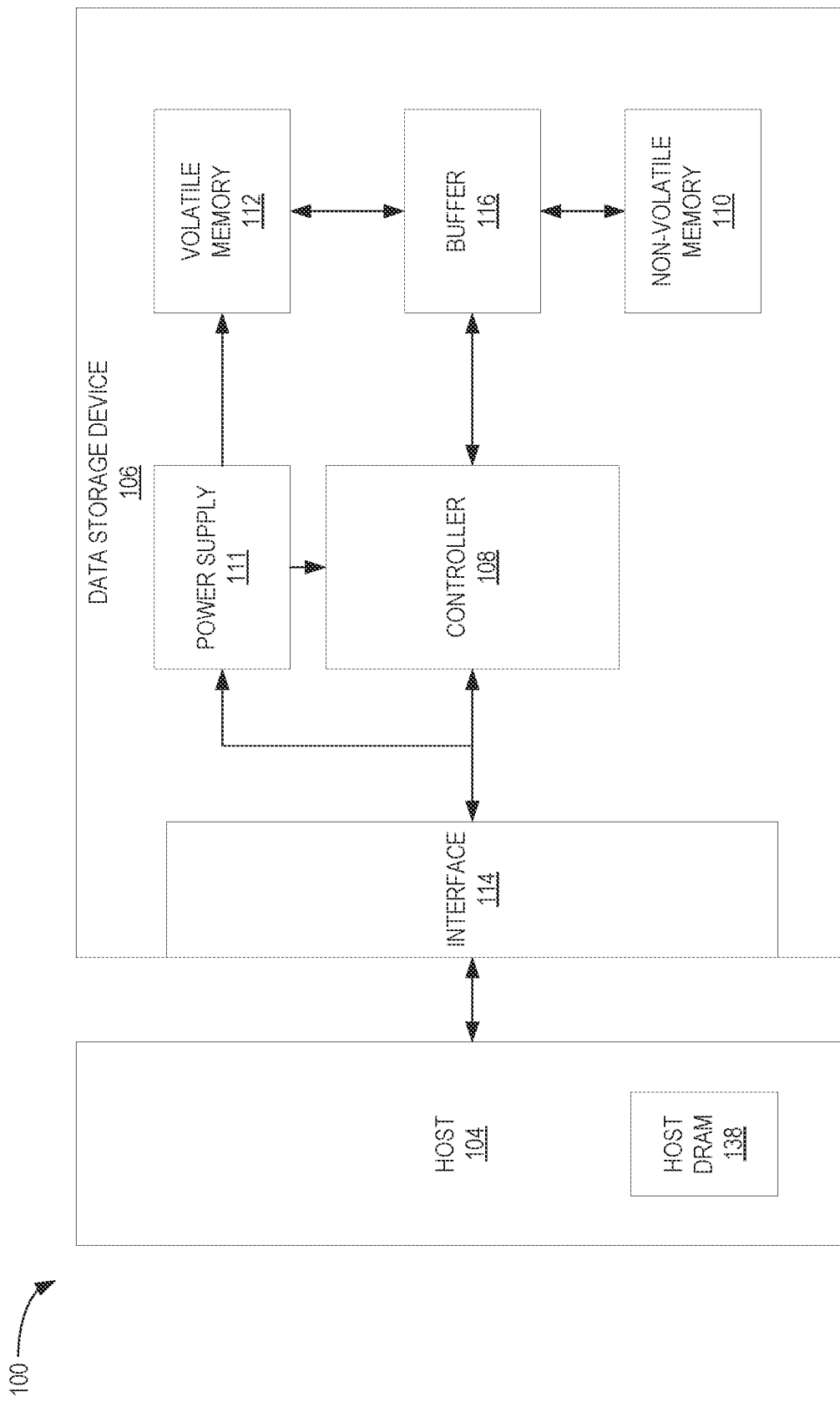
FIG. 1 is a schematic block diagram illustrating a storage system in which a data storage device may function as a storage device for a host device, according to certain embodiments.

FIG. 1 is a schematic block diagram illustrating a storage system 100 in which a host device 104 is in communication with a data storage device 106, according to certain embodiments. For instance, the host device 104 may utilize a non-volatile memory (NVM) 110 included in data storage device 106 to store and retrieve data. The host device 104 comprises a host DRAM 138. In some examples, the storage system 100 may include a plurality of storage devices, such as the data storage device 106, which may operate as a storage array. For instance, the storage system 100 may include a plurality of data storage devices 106 configured as a redundant array of inexpensive/independent disks (RAID) that collectively function as a mass storage device for the host device 104.

The host device 104 may store and/or retrieve data to and/or from one or more storage devices, such as the data storage device 106. As illustrated in FIG. 1, the host device 104 may communicate with the data storage device 106 via an interface 114. The host device 104 may comprise any of a wide range of devices, including computer servers, network-attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or other devices capable of sending or receiving data from a data storage device.

The data storage device 106 includes a controller 108, NVM 110, a power supply 111, volatile memory 112, the interface 114, and a write buffer 116. In some examples, the data storage device 106 may include additional components not shown in FIG. 1 for the sake of clarity. For example, the data storage device 106 may include a printed circuit board (PCB) to which components of the data storage device 106 are mechanically attached and which includes electrically conductive traces that electrically interconnect components of the data storage device 106 or the like. In some examples, the physical dimensions and connector configurations of the data storage device 106 may conform to one or more standard form factors. Some example standard form factors include, but are not limited to, 3.5" data storage device (e.g., an HDD or SSD), 2.5" data storage device, 1.8" data storage device, peripheral component interconnect (PCI), PCI-extended (PCI-X), PCI Express (PCIe) (e.g., PCIe x1, x4, x8, x16, PCIe Mini Card, MiniPCI, etc.). In some examples, the data storage device 106 may be directly coupled (e.g., directly soldered or plugged into a connector) to a motherboard of the host device 104.

Interface 114 may include one or both of a data bus for exchanging data with the host device 104 and a control bus for exchanging commands with the host device 104. Interface 114 may operate in accordance with any suitable protocol. For example, the interface 114 may operate in accordance with one or more of the following protocols: advanced technology attachment (ATA) (e.g., serial-ATA (SATA) and parallel-ATA (PATA)), Fibre Channel Protocol (FCP), small computer system interface (SCSI), serially attached SCSI (SAS), PCI, and PCIe, non-volatile memory express (NVMe), OpenCAPI, GenZ, Cache Coherent Interface Accelerator (CCIX), Open Channel SSD (OCSSD), or the like. Interface 114 (e.g., the data bus, the control bus, or both) is electrically connected to the controller 108, providing an electrical connection between the host device 104 and the controller 108, allowing data to be exchanged between the host device 104 and the controller 108. In some examples, the electrical connection of interface 114 may also permit the data storage device 106 to receive power from the host device 104. For example, as illustrated in FIG. 1, the power supply 111 may receive power from the host device 104 via interface 114.

The NVM 110 may include a plurality of memory devices or memory units. NVM 110 may be configured to store and/or retrieve data. For instance, a memory unit of NVM 110 may receive data and a message from controller 108 that instructs the memory unit to store the data. Similarly, the memory unit may receive a message from controller 108 that instructs the memory unit to retrieve data. In some examples, each of the memory units may be referred to as a die. In some examples, the NVM 110 may include a plurality of dies (i.e., a plurality of memory units). In some examples, each memory unit may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, each memory unit may include any type of non-volatile memory devices, such as flash memory devices, phase-change memory (PCM) devices, resistive random-access memory (ReRAM) devices, magneto-resistive random-access memory (MRAM) devices, ferroelectric random-access memory (F-RAM), holographic memory devices, and any other type of non-volatile memory devices.

The NVM 110 may comprise a plurality of flash memory devices or memory units. NVM Flash memory devices may include NAND or NOR-based flash memory devices and may store data based on a charge contained in a floating gate of a transistor for each flash memory cell. In NVM flash memory devices, the flash memory device may be divided into a plurality of dies, where each die of the plurality of dies includes a plurality of physical or logical blocks, which may be further divided into a plurality of pages. Each block of the plurality of blocks within a particular memory device may include a plurality of NVM cells. Rows of NVM cells may be electrically connected using a word line to define a page of a plurality of pages. Respective cells in each of the plurality of pages may be electrically connected to respective bit lines. Furthermore, NVM flash memory devices may be 2D or 3D devices and may be single level cell (SLC), multi-level cell (MLC), triple level cell (TLC), or quad level cell (QLC). The controller 108 may write data to and read data from NVM flash memory devices at the page level and erase data from NVM flash memory devices at the block level.

The power supply 111 may provide power to one or more components of the data storage device 106. When operating in a standard mode, the power supply 111 may provide power to one or more components using power provided by an external device, such as the host device 104. For instance, the power supply 111 may provide power to the one or more components using power received from the host device 104 via interface 114. In some examples, the power supply 111 may include one or more power storage components configured to provide power to the one or more components when operating in a shutdown mode, such as where power ceases to be received from the external device. In this way, the power supply 111 may function as an onboard backup power source. Some examples of the one or more power storage components include, but are not limited to, capacitors, super-capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

The volatile memory 112 may be used by controller 108 to store information. Volatile memory 112 may include one or more volatile memory devices. In some examples, controller 108 may use volatile memory 112 as a cache. For instance, controller 108 may store cached information in volatile memory 112 until the cached information is written to the NVM 110. As illustrated in FIG. 1, volatile memory 112 may consume power received from the power supply 111. Examples of volatile memory 112 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)).

Controller 108 may manage one or more operations of the data storage device 106. For instance, controller 108 may manage the reading of data from and/or the writing of data to the NVM 110. In some embodiments, when the data storage device 106 receives a write command from the host device 104, the controller 108 may initiate a data storage command to store data to the NVM 110 and monitor the progress of the data storage command. Controller 108 may determine at least one operational characteristic of the storage system 100 and store at least one operational characteristic in the NVM 110. In some embodiments, when the data storage device 106 receives a write command from the host device 104, the controller 108 temporarily stores the data associated with the write command in the internal memory or write buffer 116 before sending the data to the NVM 110.

KV pair data includes a key and a value, where the data of the value is addressed by the key. The key may have a size of about 1 byte to about 64 bytes and the value may have a size of about 0 bytes to about $2^{32}-1$ bytes. For example, a value having a size of about 0 bytes is an empty value. It is to be understood that the previously mentioned values are not intended to be limiting, but to provide an example of an embodiment. A KV system may include a command set that includes, in a non-limiting list, a delete command, a list command, a retrieve command, an exist command, and a store command.

The delete command may cause the controller 108 to delete the key and value associated with a specified key. The list command may cause the controller 108 to list keys that exist in a KV namespace starting at a specified key. The retrieve command may cause the controller 108 to retrieve the value associated with a specified key. The exist command may cause the controller 108 to return a status indicating whether a KV exists for a specified key to the command generator, such as the host device 104. The store command may cause the controller 108 to store a KV to a KV namespace.

In the KV system, there may be one or more KV formats present, each with a different set of KV sizes and properties. Furthermore, each KV format may have a relative performance (RP) requirement which may dictate where the KV pair data is stored in the NVM 110. It is to be understood that the term "requirement" may refer to a general guideline, such that the controller 108 may attempt to program KV pair data in the RP specified wordlines or blocks, but may also program the KV pair data in adjacent RP groups to the RP requirement. Blocks of the NVM 110 may be classified according to conditions that relate to the health of the block. For example, conditions relating to the health of the block may include, but not limited to, a number of program erase cycles (PEC), a bit error rate (BER) severity, a physical location of a wordline on the block, and an amount of time exceeding a temperature threshold or thresholds. Wordlines near an edge of the block may exhibit higher BER than wordlines near the middle of the block.

Therefore, blocks and/or wordlines of the blocks may be logically grouped into performance groups. For example, there may be four groups where a first group has the highest performance, a second group has a performance lower than the first group, a third group has a performance lower than the second group, and a fourth group has a performance lower than the third group. An example of RP values is shown in Table 1 below.

TABLE 1

| Value | Definition |
|---|---|
| 00b | Best Performance |
| 01b | Better Performance |
| 10b | Good Performance |
| 11b | Degraded Performance |

When storing KV pair data, the value of the KV pair data may be divided between wordlines and blocks of the NVM 110 that have different health properties in order to ensure that overall read throughput is not impaired due to random placement across the blocks. Additionally, prioritization of values may be incorporated. For example, values with a higher RP requirement are placed in blocks that have a first health and values with a lower RP requirement are placed in blocks that have a second health, where the first health is greater than the second health. For example, the first health may be associated with "best performance" or "00b" of Table 1 and the second health may be associated with "better performance" or "01 b" of Table 1 above.

Figure 2:
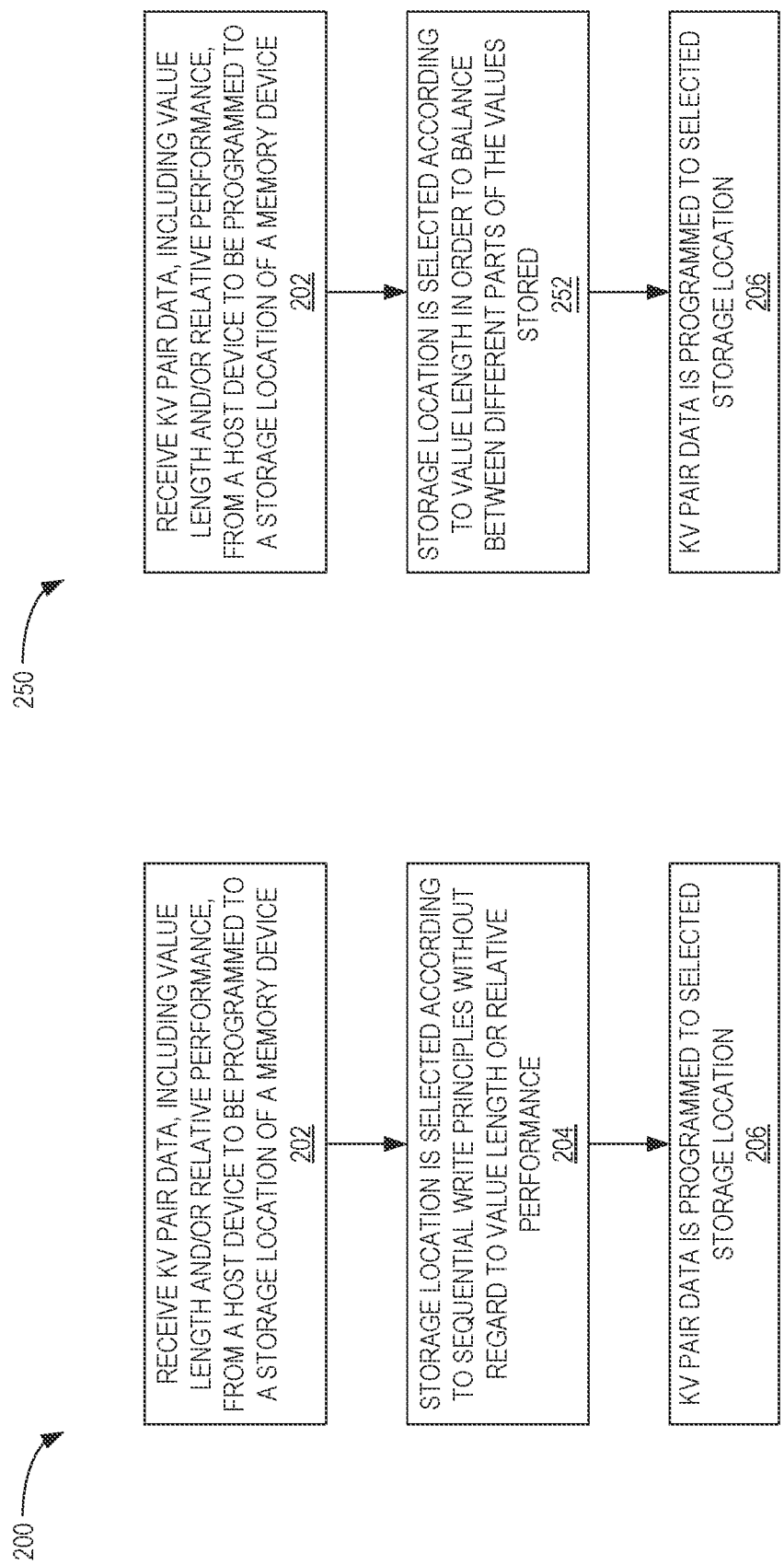
FIG. 2A is a flow diagram illustrating a method of programming a value of a KV pair data to a memory device, according to certain embodiments.
FIG. 2B is a flow diagram illustrating a method of balancing values over a memory device during programming of a value of a KV pair data to a memory device, according to certain embodiments.

FIG. 2A is a flow diagram illustrating a method 200 of programming a value of a KV pair data to a memory device, according to certain embodiments. Aspects of the storage system 100 of FIG. 1 may be referenced for exemplary purposes herein. For example, method 200 may be executed by controller 108. At block 202, the controller 108 receives KV pair data from the host device 104 to be programmed to the NVM 110. The KV pair data includes a value length and a RP requirement. At block 204, the controller 108 selects a storage location in the NVM 110 according to sequential write principles without regard to the value length or the RP requirement of the KV pair data. At block 206, the controller 108 programs the KV pair data to the selected storage location.

FIG. 2B is a flow diagram illustrating a method 250 of balancing values over a memory device during programming of a value of a KV pair data to a memory device, according to certain embodiments. Aspects of the storage system 100 of FIG. 1 may be referenced for exemplary purposes herein. For example, method 250 may be executed by controller 108.

At block 202, the controller 108 receives KV pair data from the host device 104 to be programmed to the NVM 110. The KV pair data includes a value length and a RP requirement. Typically, the controller 108 operates in a manner to ensure a minimum quality of service (QoS) requirement or throughput requirement for each 4 KB flash management unit (FMU). However, operations of the data storage device 106 may be limited as data may be relocated often in order to ensure data retention quality and ensure that blocks are generally evenly worn. However, in KV systems, QoS and throughput may be measured per value. When throughput and QoS are measured per value, the storage of values may be balanced as a whole (e.g., over the entirety of a memory device) rather than per FMU. At block 252, the controller 108 selects a storage location in the NVM 110 according to the value length in order to balance between the different parts of the values stored in the NVM 110. For example, if the values are more concentrated in a first location of the NVM 110 associated with some wear level, then the controller 108 may select a location in a second location of the NVM 110 associated with another wear level, where the second location is different than the first location, to store the KV pair data. The second location may be picked according to its wear level to balance the QoS and throughput of the entire read value. At block 206, the controller 108 programs the KV pair data to the selected storage location.

Figure 3:
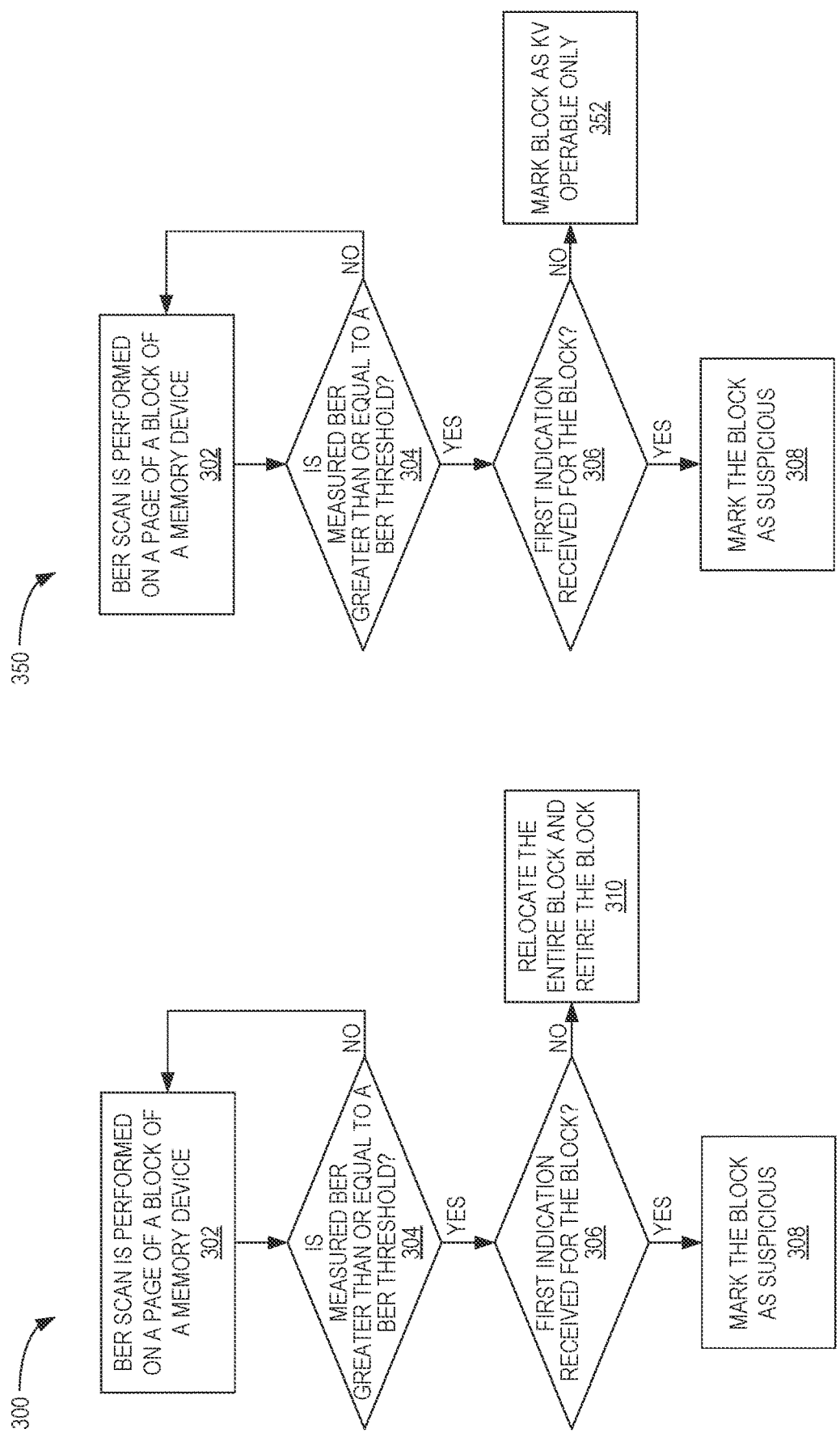
FIG. 3A is a flow diagram illustrating a method of block retirement, according to certain embodiments.
FIG. 3B is a flow diagram illustrating a method of block retirement for a KV system, according to certain embodiments.

FIG. 3A is a flow diagram illustrating a method 300 of block retirement, according to certain embodiments. Aspects of the storage system 100 of FIG. 1 may be referenced for exemplary purposes herein. For example, method 300 may be executed by controller 108. At block 302, the controller 108 performs a BER scan on a page of a block of a memory device, such as the NVM 110. It is to be understood that the BER scan may be per wordline or per block rather than per page. Blocks may be categorized in a granularity level based on the BER scan. For example, in certain blocks, edge wordlines exhibits higher BER than middle wordlines. Therefore, the controller 108 may, during or after a scan of a block, group edge wordlines having a similar BER into a first group and middle wordlines having a similar BER into a second group.

At block 304, the controller 108 determines if the measured BER of the scanned page is greater than or equal to a BER threshold. It is to be understood that there may be more than one BER threshold, where each BER threshold corresponds with a severity of the BER. If the measured BER is not greater than or equal to the BER threshold at block 304, then method 300 returns to block 302. However, if the measured BER is greater than or equal to the BER threshold at block 304, then the controller 108 determines if there has been a first indication (or a previous indication) of a high BER (e.g., the page or another page of the block was scanned previously and found to have a BER that is greater than or equal to the BER threshold) for the block at block 306. If there was not a previous or a first indication for the block at block 306, then the controller 108 marks the block as suspicious, where marking is an indication, at block 308. However, if there was a previous or a first indication for the block at block 306, then the controller 108 relocates the data of the entire block and retires the block at block 310.

FIG. 3B is a flow diagram illustrating a method 350 of block retirement for a KV system, according to certain embodiments. Aspects of the storage system 100 of FIG. 1 may be referenced for exemplary purposes herein. For example, method 350 may be executed by controller 108. At block 304, the controller 108 determines if the measured BER of the scanned page is greater than or equal to a BER threshold. It is to be understood that there may be more than one BER threshold, where each BER threshold corresponds with a severity of the BER. If the measured BER is not greater than or equal to the BER threshold at block 304, then method 300 returns to block 302. However, if the measured BER is greater than or equal to the BER threshold at block 304, then the controller 108 determines if there has been a first indication (or a previous indication) of a high BER (e.g., the page or another page of the block was scanned previously and found to have a BER that is greater than or equal to the BER threshold) for the block at block 306. It is contemplated that there may be a threshold limit of indications, such that the controller 108 may determine if the number of previous indications is greater than the threshold limit of indications.

If there was not a previous or a first indication for the block at block 306, then the controller 108 marks the block as suspicious, where marking is an indication, at block 308. However, if there was a previous or a first indication for the block at block 306, rather than relocating the data of the entire block and retiring the block, such as at block 310 of FIG. 3B, the controller 108 marks the block as KV operable only, such that the block is used for operations related to KV pair data (e.g., storage of KV pair data), at block 352. Data residing in the block marked may be relocated to another block that is not marked for KV operable only. Thus, blocks that may have a BER greater than a BER threshold may still be used instead of retiring and discontinuing use of the block. Furthermore, the marking of the block may be based on a severity of the measured BER. For example, depending on the severity of the BER, the marking may indicate that the block is appropriate for use for a RP corresponding to "good performance" rather than "better performance."

Figure 4:
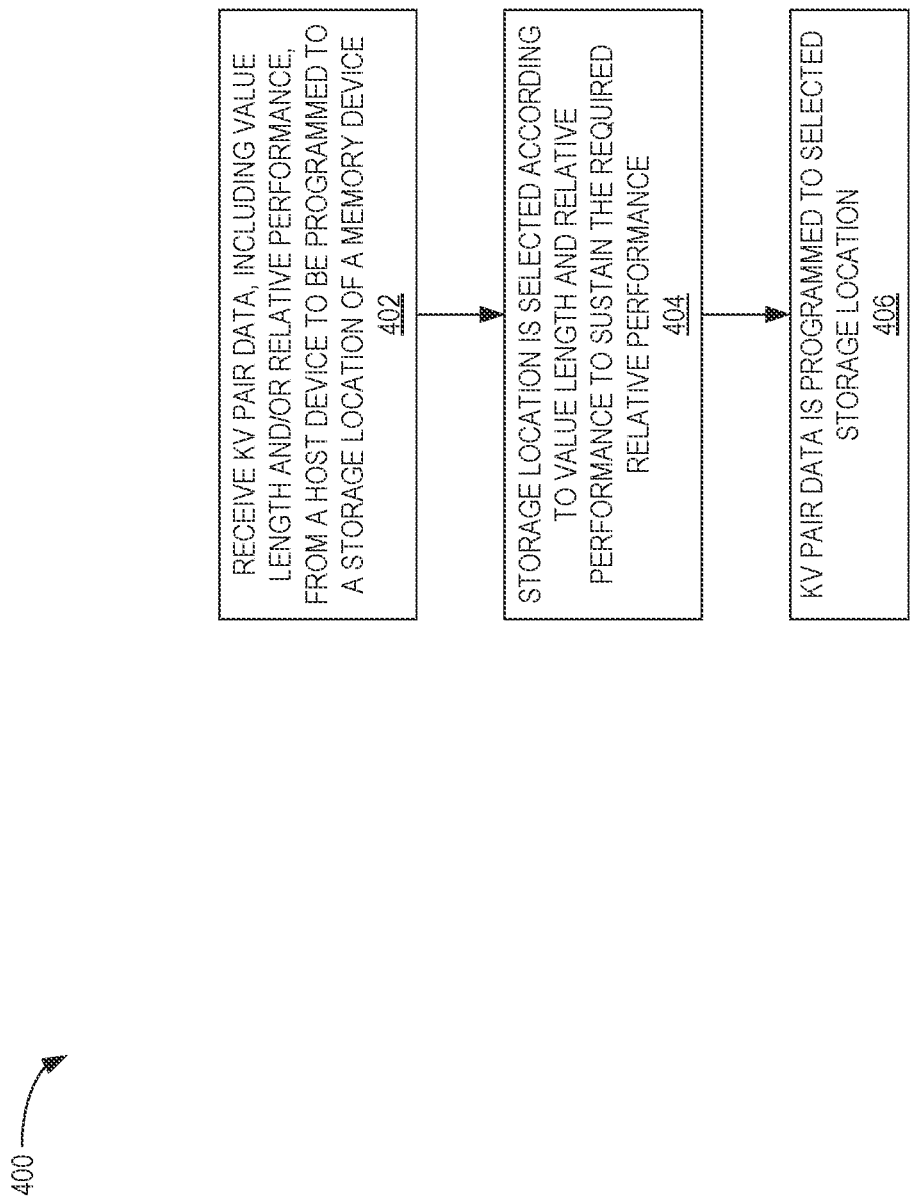
FIG. 4 is a flow diagram illustrating a method of using value length and relative performance of the KV pair data to program the KV pair data to a memory device, according to certain embodiments.

FIG. 4 is a flow diagram illustrating a method 400 of using value length and relative performance of the KV pair data to program the KV pair data to a memory device, according to certain embodiments. Aspects of the storage system 100 of FIG. 1 may be referenced for exemplary purposes herein. For example, method 400 may be executed by controller 108. At block 402, the controller 108 receives KV pair data from the host device 104 to be programmed to the NVM 110. The KV pair data includes a value length and a RP requirement. If the RP requirement indicates low performance, block retirement conditions, such as the BER thresholds, may be further relaxed (e.g., increased) and blocks that have a higher BER may be included in a block pool that corresponds to a RP requirement, where the block may not have previously been included in the block pool due to reaching or exceeding the non-relaxed BER threshold. At block 404, the controller 108 selects a storage location in the NVM 110 according to the value length and the RP requirement to sustain the required RP in order to balance the values stored in the NVM 110. At block 406, the controller 108 programs the KV pair data to the selected storage location.

By selecting memory locations of a memory device based on balancing value storage and relative performance requirements, memory utilization of the memory device in a data storage device having a KV system may be improved.

In one embodiment, a data storage device includes a memory device and a controller coupled to the memory device. The controller is configured to determine a health of a plurality of wordlines of a block of a plurality of blocks, receive a key value (KV) pair, where the KV pair includes a value length, select a wordline of the plurality of wordlines based on the health, and program the KV pair to the selected wordline.

The health is based on a bit error rate (BER), a program erase count (PEC), and a physical location of a wordline in the block. The physical location is either a first location or a second location, and wherein the first location is an edge wordline of the block and the second location is a middle wordline of the block. The first location has a first BER, and the second location has a second BER, and wherein the first BER is greater than the second BER. The selected wordline is a part of a marked block, and wherein the marked block has a bit error rate (BER) greater than a threshold. The marked block is marked for storing KV database data only. Non-KV database data is relocated from the marked block to a non-marked block. The controller is further configured to mark the block having a BER greater than a threshold value based on a severity of the BER. Each level of the hierarchy corresponds to a relative performance level. The KV pair further includes a relative performance indicator. The selected wordline is selected according to the value length of the KV pair. The value length is an amount of memory needed to store the KV pair.

In another embodiment, a data storage device includes a memory device and a controller coupled to the memory device. The controller is configured to determine a bit error rate (BER) of a page on a block, determine that the BER is greater than or equal to a BER threshold, determine that the block has had more than one high BER indication, and mark the block as key value (KV) pair operable only, where the marked block stores only KV database data.

The controller is further configured to relocate non-KV database data from the marked block to a non-marked block. The controller is further configured to determine that a number of high BER indications for the marked block is greater than or equal to an indication threshold, relocate the KV database data from the marked block to another marked block, and retire the marked block. The controller is further configured to mark the block as either a first level marked block or a second level marked block. The first level marked block has a first BER and the second level marked block has a second BER. The first BER is less than the second BER. A KV pair includes a relative performance indicator. The relative performance indicator is either a first level relative performance or a second level relative performance. The first level relative performance has a performance requirement greater than the second level relative performance. The controller is further configured to write the KV pair having the first level relative performance to a first level marked block and the KV pair having the second level relative performance to a second level marked block. The block has an overall performance level. The overall performance level is an average of a first performance level and a second performance level. The first performance level corresponds to a performance of edge wordlines of the block and the second performance level corresponds to a performance of middle wordlines of the block. The first performance level and the second performance level are different.

In another embodiment, a data storage device includes memory means and a controller coupled to the memory means. The controller is configured to determine a physical storage location for key value (KV) pair data based on value length and/or relative performance and program the KV pair data to the determined physical storage location.

The determined physical storage location has a bit error rate (BER) greater than or equal to a threshold sufficient for storing non-KV pair data. The relative performance corresponds to a severity of BER of the determined physical storage location.

While the foregoing is directed to embodiments of the present disclosure, other and further embodiments of the disclosure may be devised without departing from the basic scope thereof, and the scope thereof is determined by the claims that follow.

What is claimed is:

1. A data storage device, comprising:
a memory device; and
a controller coupled to the memory device, the controller configured to:
determine a health of a plurality of wordlines of a block of a plurality of blocks;
receive a key value (KV) pair, wherein the KV pair includes a value length;
select a wordline of the plurality of wordlines based on the health; and
program the KV pair to the selected wordline, wherein the selected wordline is a part of a marked block, and wherein the marked block has a bit error rate (BER) greater than a threshold, wherein the marked block is marked for storing KV database data only.

2. The data storage device of claim 1, wherein the health is based on a bit error rate (BER), a program erase count (PEC), and a physical location of a wordline in the block.

3. The data storage device of claim 2, wherein the physical location is either a first location or a second location, and wherein the first location is an edge wordline of the block and the second location is a middle wordline of the block.

4. The data storage device of claim 3, wherein the first location has a first BER, and the second location has a second BER, and wherein the first BER is greater than the second BER.

5. The data storage device of claim 1, wherein the controller is further configured to mark the block having a BER greater than a threshold value based on a severity of the BER, wherein each level of hierarchy corresponds to a relative performance level, and wherein the KV pair further includes a relative performance indicator.

6. The data storage device of claim 1, wherein the selected wordline is selected according to the value length of the KV pair.

7. The data storage device of claim 6, wherein the value length is an amount of memory needed to store the KV pair.

8. A data storage device, comprising:
a memory device; and
a controller coupled to the memory device, the controller configured to:
determine a health of a plurality of wordlines of a block of a plurality of blocks;
receive a key value (KV) pair, wherein the KV pair includes a value length;

select a wordline of the plurality of wordlines based on the health; and program the KV pair to the selected wordline, wherein the selected wordline is a part of a marked block, and wherein the marked block has a bit error rate (BER) greater than a threshold, wherein non-KV database data is relocated from the marked block to a non-marked block.

9. The data storage device of claim 8, wherein the marked block is for storing KV database data only.

10. The data storage device of claim 8, wherein the selected wordline is selected according to a relative performance of the KV pair.

11. A data storage device, comprising:
a memory device; and
a controller coupled to the memory device, the controller configured to:
    determine a bit error rate (BER) of a page on a block;
    determine that the BER is greater than or equal to a BER threshold;
    determine that the block has had more than one high BER indication; and
    mark the block as key value (KV) pair operable only, wherein the marked block stores only KV database data.

12. The data storage device of claim 11, wherein the controller is further configured to relocate non-KV database data from the marked block to a non-marked block.

13. The data storage device of claim 11, wherein the controller is further configured to:
    determine that a number of high BER indications for the marked block is greater than or equal to an indication threshold;
    relocate the KV database data from the marked block to another marked block; and
    retire the marked block.

14. The data storage device of claim 11, wherein the controller is further configured to mark the block as either a first level marked block or a second level marked block, wherein the first level marked block has a first BER and the second level marked block has a second BER, and wherein the first BER is less than the second BER.

15. The data storage device of claim 14, wherein a KV pair includes a relative performance indicator, wherein the relative performance indicator is either a first level relative performance or a second level relative performance, and wherein the first level relative performance has a performance requirement greater than the second level relative performance.

16. The data storage device of claim 15, wherein the controller is further configured to write the KV pair having the first level relative performance to a first level marked block and the KV pair having the second level relative performance to a second level marked block.

17. The data storage device of claim 11, wherein the block has an overall performance level, wherein the overall performance level is an average of a first performance level and a second performance level, wherein the first performance level corresponds to a performance of edge wordlines of the block and the second performance level corresponds to a performance of middle wordlines of the block, and wherein the first performance level and the second performance level are different.

18. A data storage device, comprising:
memory means; and
a controller coupled to the memory means, the controller configured to:
    determine a physical storage location for key value (KV) pair data based on value length and/or relative performance;
    program the KV pair data to the determined physical storage location;
    determine that a block of the memory means has bit error rate (BER) greater than a threshold; and
    mark the block for storing KV pair data only.

19. The data storage device of claim 18, wherein the determined physical storage location has a bit error rate (BER) greater than or equal to a threshold sufficient for storing non-KV pair data.

20. The data storage device of claim 18, wherein the relative performance corresponds to a severity of BER of the determined physical storage location.

* * * * *